United States Patent [19]
DenBaars et al.

[11] Patent Number: 5,796,771
[45] Date of Patent: Aug. 18, 1998

[54] MINIATURE SELF-PUMPED MONOLITHICALLY INTEGRATED SOLID STATE LASER

[75] Inventors: Steven P. DenBaars; James S. Speck, both of Goleta, Calif.; Charles H. Church, Chapel Hill, N.C.; Robert G. Wilson, Winnetka, Calif.; John M. Zavada, Durham, N.C.

[73] Assignees: The Regents of the University of California, Oakland, Calif.; The United States of America as represented by the Secretary of the Army, Washington, D.C.; Hughes Electronics, Los Angeles, Calif.

[21] Appl. No.: 699,361

[22] Filed: Aug. 19, 1996

[51] Int. Cl.$^6$ .................................................. H01S 3/091
[52] U.S. Cl. ........................... 372/75; 372/43; 372/50; 372/69; 372/70; 372/68
[58] Field of Search ................................. 372/7, 10, 39, 372/40, 43, 50, 66, 69, 70, 71, 75, 92, 99, 68

[56] References Cited

U.S. PATENT DOCUMENTS

| | | | |
|---|---|---|---|
| 4,205,278 | 5/1980 | George et al. | 331/94.5 |
| 4,737,960 | 4/1988 | Tsang | 372/45 |
| 5,159,605 | 10/1992 | Yagi et al. | 372/75 |
| 5,301,204 | 4/1994 | Cho et al. | 372/69 |
| 5,365,538 | 11/1994 | Tumminelli et al. | 372/66 |
| 5,436,919 | 7/1995 | Chwalek et al. | 372/7 |
| 5,463,649 | 10/1995 | Ashby et al. | 372/40 |
| 5,513,204 | 4/1996 | Jayaraman | 372/96 |
| 5,574,738 | 11/1996 | Morgan | 372/28 |

FOREIGN PATENT DOCUMENTS

| | | | |
|---|---|---|---|
| 2 212 862 | 3/1972 | Germany | 372/45 X |

*Primary Examiner*—Brian Healy
*Attorney, Agent, or Firm*—Merchant, Gould, Smith, Edell, Welter & Schmidt

[57] ABSTRACT

The present invention is an integrated, diode laser-pumped, solid state laser which can be fabricated entirely with semiconductor fabrication techniques. The laser includes a substrate, a semiconductor light source grown over the substrate to provide pump light and a solid state laser grown over the substrate. The semiconductor light source produces pump light at a wavelength useful for pumping the solid state laser. The solid state laser includes a pump mirror transparent to the pump light, an output mirror, and a doped semiconductor layer deposited between the pump and output mirrors, the semiconductor, dielectric or polymer layer being doped with active metal ions. The pump light from the semiconductor light source is closely coupled to the solid state laser and passes through the pump mirror to pump the active metal ions.

49 Claims, 4 Drawing Sheets

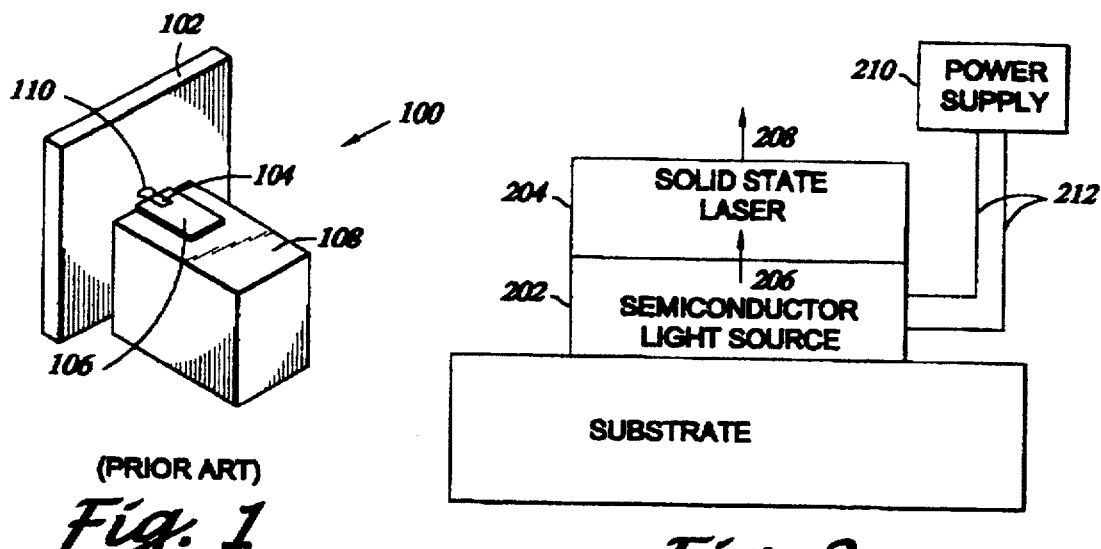
(PRIOR ART)
Fig. 1
Fig. 2
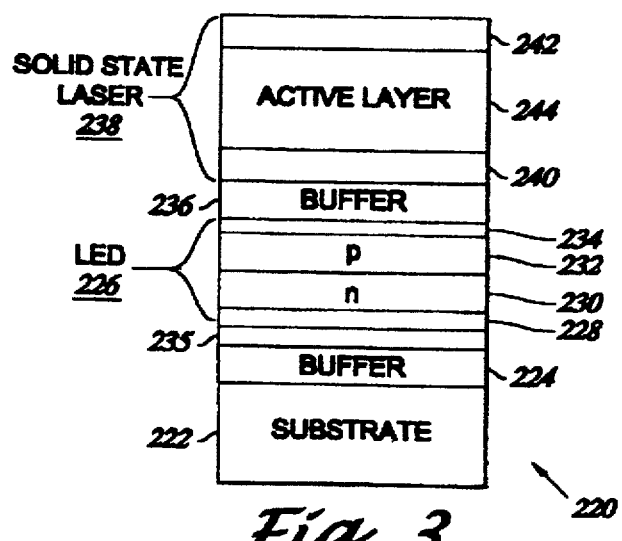
Fig. 3

MINIATURE SELF-PUMPED MONOLITHICALLY INTEGRATED SOLID STATE LASER

STATEMENT AS TO RIGHTS TO INVENTIONS MADE UNDER FEDERALLY SPONSORED RESEARCH AND DEVELOPMENT

This invention was made with Govenment support under Grant No. DAAH04-95-1-0329, awarded by the Army. The Government has certain rights in this invention.

BACKGROUND OF THE INVENTION

1. Field of the Invention

This invention relates in general to laser devices, and in particular to a solid state laser fabricated on the same chip as its semiconductor pump source.

Description of Related Art

Solid state lasers which are pumped by semiconductor diode lasers are known. Diode laser pumping of solid state lasers is desirable since the overall laser efficiency can be very high, due to the laser emitting only light which is absorbed by the laser crystal. Consequently, the difficulties involved with thermal management of the laser system are reduced, and the resultant laser system will have lower power requirements. In addition, laser systems can be built with a smaller footprint.

Typically, high power solid state lasers employ a laser which is externally pumped by laser lamps, whereas low power solid state lasers employ a laser crystal externally pumped by a single laser diode. FIG. 1 illustrates a common geometry for a low power, diode laser-pumped solid state laser 100. The laser crystal 102 is formed as a thin rectangular prism, with appropriate coatings on either surface as high reflector and output coupler. The pump laser diode 104 is soldered on to a copper block 106, and the copper block 106, in turn, is mounted on a heatsink 108. The light emitted by the laser diode 104 pumps a small region 110 of the laser crystal. Fabrication of this laser 100 includes mating the laser diode assembly 104/106/108 to the laser crystal 102 while ensuring correct relative orientation, and is normally performed by hand. In addition, the chip of solid state laser crystal 102 has dimensions of several millimeters, and therefore is too large to be used in applications where the overall laser volume is required to be minimal, such as optical data storage.

Fabrication of high power, laser diode-pumped solid state lasers is more complicated, since it requires stacking and aligning many laser diode arrays in two dimensions, and arranging the laser diode stacks around the solid state laser crystal. Again, fabrication of high power systems is normally performed by hand. Thus, the fabrication costs of both low and high power solid state lasers remains high.

There is therefore a need to increase the degree of integration of diode laser-pumped solid state lasers, in order to overcome current high fabrication costs, and to allow the fabrication of solid state lasers whose size approaches the size of semiconductor lasers.

SUMMARY OF THE INVENTION

To minimize the limitations in the prior art described above, and to minimize other limitations that will become apparent upon reading and understanding the present specification, the present invention discloses, A miniature, self-pumped monolithic solid-state laser is proposed.

An object of the present invention is to provide an integrated, diode laser-pumped, solid state laser which can be fabricated with modemfabrication techniques, such as semiconductor or dielectric or polymer processing.

A feature of the present invention is an integrated solid state laser device which includes a substrate, a semiconductor light source grown over the substrate to provide pump light and a solid state laser structure grown over the substrate. The solid state laser structure includes a pump mirror transparent to the pump light, an output mirror, and a doped semiconductor layer deposited between the pump and output mirrors, the semiconductor/dielectric/polymer layer being doped with active metal ions; wherein pump light from the semiconductor light source is closely coupled to the solid state laser and passes through the pump mirror to pump the active metal ions.

An advantage of the present invention is that it may use a light emitting diode or a semiconductor laser as the source of pump light for the solid state laser.

Another advantage of the present invention is that it may be used with a wide range of metal ion active species to produce output light at a variety of wavelengths, and a corresponding wide range of semiconductor compounds to produce the pump light for the solid state laser. Another advantage of the present invention is that it uses wideband material (gallium nitride) as the pump source. Therefore, the entire visible region of the wavelength spectrum (blue, green, red) can be pumped.

BRIEF DESCRIPTION OF THE DRAWINGS

Referring now to the drawings in which like reference numbers represent corresponding parts throughout:

FIG. 1 illustrates a prior art diode laser-pumped solid state laser;

FIG. 2 illustrates a generalized view of the monolithically integrated, self-pumped solid state laser according to the present invention;

FIG. 3 illustrates a light emitting diode-based monolithically integrated, self-pumped solid state laser according to a first embodiment of the present invention;

DETAILED DESCRIPTION OF THE PREFERRED EMBODIMENTS

Figure 4:
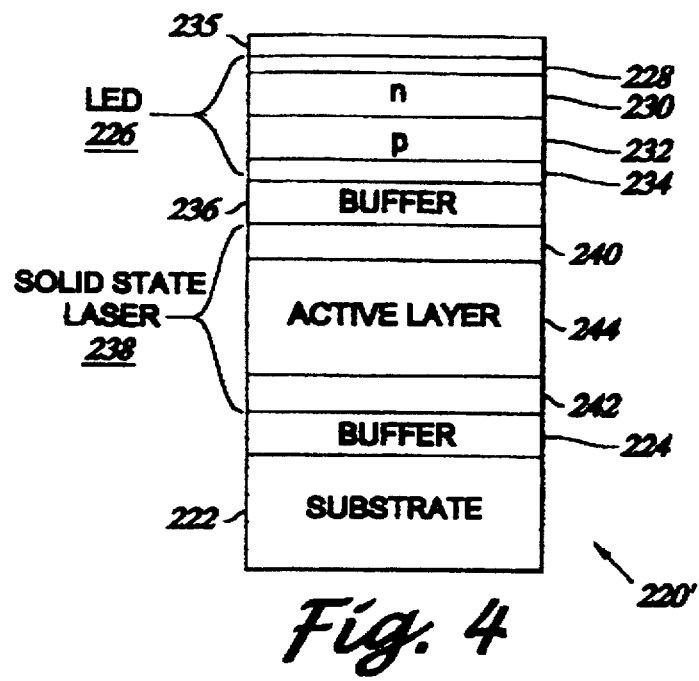
FIG. 4 illustrates an alternative arrangement of the first embodiment of the present invention.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

In the following description, the term solid state laser is used to describe a laser whose active medium is formed from a crystal/polymer/glass or gel doped with metal ions, typically one of the rare-earth or transition metals. The laser is optically pumped by illuminating the crystal with light which is absorbed by the metal ions. The laser oscillates through a stimulated transition of an electron between electronic energy levels of the metal ion.

1. Semiconductors for Producing Pump Light

The process of engineering semiconductor compounds to produce selected band gap energies is known in the art. A wide range of semiconductor compounds may be used to generate pump light for pumping solid state lasers. Aluminum nitride is a semiconductor material with a band gap corresponding to an optical wavelength of approximately 200 nm, and gallium nitride is a semiconductor material with a band gap corresponding to an optical wavelength of approximately 350 nm. By forming compounds of aluminum gallium nitride, and by varying the relative amounts of aluminum and gallium, the band gap of aluminum gallium nitride may be varied between 200 nm and 350 nm, and it is, therefore, possible to design semiconductor light source based on aluminum gallium nitride having an emission wavelength in this wavelength range.

Likewise, indium nitride is a semiconductor having a band gap corresponding to an optical wavelength of approximately 620 nm. By forming compounds of indium gallium nitride, in which the relative quantities of indium and gallium are controlled, it is possible to engineer a semiconductor material capable of emitting light with a selected wavelength in the range of 350–620 nm. Thus, by combining aluminum, gallium and indium in the same compound, it is possible to produce light ranging from 200–620 nm from by using $Al_xGa_yIn_{1-x-y}N$, where $x+y \leq 1$.

Longer wavelengths of light may be generated in IIIV semiconductor compounds by introducing arsenic. Gallium arsenide is a semiconductor compound whose band gap corresponds to an optical wavelength of approximately 880 nm. Controlling the relative quantities of nitrogen and arsenic in gallium nitride arsenide, allows one to control the band gap of the semiconductor compound over a range from 350 nm to 880 nm. In a similar manner, the compound indium gallium arsenide nitride may be engineered to produce a band gap corresponding to optical wavelengths in the region of the visible to infrared range by varying the relative quantities of each element present in the compound. $In_w Ga_x As_y N_z$, where $w+x=1$ and $y+z=1$. Likewise, indium aresnide nitride may be engineered to produce a band gap corresponding to optical wavelengths in the region of approximately 1 µm to beyond 10 µm by varying the relative quantities of arsenic and nitrogen entering the compound, i.e. InAswN1-w, where w varies from 0 upwards. It is understood that other wavelength ranges may also be obtained through the use of semiconducting materials including other Group III or V elements such as aluminum or phosphorous.

2. Solid State Laser Metal Ions.

A variety of metal ion dopants may be used to dope a crystal for use as the active medium of a solid state laser (see, for example, Solid State Laser Engineering, 2nd edition, W. Koechner, Springer Verlag, Berlin, 1988). The active metal dopants are optically pumped by pump photons, preferably emitted by a semiconductor pump source, with the result that electrons in the outer shell of the metal dopant ion are excited to a higher energy level. If sufficient numbers of the metal ion are excited in this manner, then a population inversion may be induced and the solid state laser oscillates. The dopant metal ions fall into two broad categories, rare earth metals and transition metals. Suitable rare earth metals include erbium, neodymium, holmium, praseodymium, europium, ytterbium and thulium. Transition metals include chromium and titanium. Solid state lasers employing these rare earth metals and transition metals doped into insulating crystals are known in the art. Where metal ions are referred to in the following text, the ionic charge state has been omitted. For example, where there is a reference to an erbium (Er) ion, it is understood that this refers to an $Er^{3+}$ ion.

3. General Description of Invention

FIG. 2 generally illustrates the invention. A semiconductor light source 202 is fabricated on top of a substrate 200. The semiconductor light source 202 may be any semiconducting device which emits light, such as a light emitting diode LED or a semiconductor laser including an edge, emitting semiconductor laser and a vertical cavity, surface emitting laser (VCSEL). The semiconductor light source 202 is fabricated using conventional semiconductor fabrication techniques, including photolithography, etching, ion implantation, ion diffusion, epitaxial growth, and the like. Fabricated adjacent to the semiconductor light source 202 is a solid state laser 204. The active medium of the solid state laser 204 is formed from a semiconductor or dielectric or polymer host layer doped with metal ions. The solid state laser 204 is also fabricated using standard semiconductor fabrication techniques, such as photolithography, etching, ion implantation, ion diffusion, and epitaxial growth. FIG. 2 illustrates the solid state laser to be on the upper surface of the semiconductor light source 202. However, the solid state laser 204 may also be fabricated on the substrate 200, in a position beside the semiconductor light source 202 or, alternatively, the solid state laser 204 may be fabricated between the substrate 200 and the semiconductor light source 202. The solid state laser 204 is physically close to the semiconductor light source 202, so that pump light 206 emitted by the semiconductor light source 202 is closely coupled to the solid state laser 204. The wavelength of the pump light 206 is selected to be absorbed by the dopant metal ions in the solid state laser 204. The band gap of the semiconductor host layer is selected so that the pump light 206 is not absorbed by the semiconductor host, but only by the doped metal ions. The resonator for the solid state laser 204 may also be fabricated using conventional semiconductor fabrication techniques, and so the full integrated structure of the monolithically integrated self-pumped solid state laser may be fabricated in a multi-step fabrication process. This removes the need for individual laser diode and solid state laser components as used in the prior art, and avoids several fabrication steps currently required for laser diode-pumped solid state lasers. Additionally, since the lasers of the present invention are fabricated using semiconductor growth techniques, large scale integration is possible, including the production of large area arrays of monolithically integrated self-pumped solid state lasers to produce high power, without the attendant need to stack laser diodes into two dimensional arrays and arrange them by hand around a laser crystal.

When the semiconductor light source 202 is activated, for example by an electric current or an electron beam, the pump light 206 pumps the solid state laser 204 which then oscillates to produce output light 208, whose wavelength is set by the stimulated electronic transition of the metal ions doped in the semiconductor host layer of the solid state laser 204. The semiconductor light source 202 may be powered by an electrical power supply 210 which is connected to the semiconductor light source 202 via connections 212 as shown.

The invention is better understood by referring to the following examples describing various embodiments of the invention.

Example 1. Indium Gallium Nitride LED-Pumped Vertical Cavity Erbium Solid State Laser In FIG. 3 is shown the invention according to a first embodiment. The first embodiment of the self-pumped monolithically integrated solid state laser 220 includes a semiconductor substrate 222, preferably of saphire although other materials may be used, such as silicon carbide. On top of the substrate 222 is a first buffer layer 224. The first buffer layer 224 is preferably an epitaxially grown layer of gallium nitride which is relatively defect free so as to provide a good surface for growing a succeeding layer, and which also provides lattice parameter compensation for any difference in the lattice parameter of the substrate and the next layer to be grown on top of the buffer layer 224. A light emitting diode structure (LED) 226 is grown on top of the first buffer layer 224. The LED structure 226 includes a lower electrode 228, an n-type gallium nitride layer 230, a p-type gallium nitride layer 232 and an upper, transparent electrode 234. Each of the layers 228-234 is grown by a technique such as metal organic chemical vapor deposition (MOCVD) or molecular beam epitaxy (MBE). When a voltage is applied across the lower electrode 228 and transparent electrode 234, the resultant current flowing through the diode junction formed by the n-type layer 230 and the p-type layer 232 results in the recombination of carriers at the junction and the emission of pump light having a wavelength, $\lambda_p$, of approximately 400–500 nm. The LED 226 may also include a reflective layer 235, or reflective structure, below the diode junction which reflects light initially emitted by the LED in a downward direction back toward the solid state laser 238. The LED structure 226 may alternatively use the substrate 222 as an electrode, thus obviating the need for the lower electrode 228.

Above the LED structure 226 is deposited a second buffer layer 236 using a technique such as MOCVD or MBE. This second buffer layer 236 provides lattice parameter matching between the LED structure 226 and the solid state laser 238 grown on top of the second buffer layer 236.

The solid state laser 238 includes a pump mirror 240 and an output mirror 242, which together form the cavity of the solid state laser 238, and between which is deposited the solid state laser's active medium 244. The pump mirror 240 transmits pump light emitted by the LED 226 and having a wavelength of $\lambda_p$, into the active medium 244, while reflecting the laser light, wavelength $\lambda_s$, produced by the solid state laser 238. The output mirror 242 transmits a predetermined fraction of the laser light within the cavity of the solid state laser 238, and reflects the remainder of the laser light. The pump mirror 240 and the output mirror 242 are formed using stacks of quarter wave layers to form the mirrors. The reflectivity of the pump mirror 240 at $\lambda_s$ preferably ranges from 96% to 98% and the reflectivity of the output mirror at $\lambda_s$ preferably ranges from 90% to 95%%. The layers of mirrors 240 and 242 are typically grown by MOCVD. The active medium 244 is preferably layer of gallium nitride doped with erbium at a concentration ranging from $10^{19}$ to $10^{20}$ atoms per cc. The active medium 244 preferably has a thickness of approximately 1–5 μm, although it is understood that the thickness of the active medium 244 may be altered according to standard laser design principles, depending on such factors as the concentration of the metal ion, the absorption and gain cross-sections of the laser transitions, and the Q of the cavity of the solid state laser 238.

The transparent electrode 234 of the LED 226 may alternatively be positioned between other layers of the laser 220 as long as there is a conductive path between the transparent electrode 234 and the p-type layer 232 of the LED 226.

The first embodiment of the invention, like the other embodiments described hereinbelow, may be operated continuously (cw mode) where the semiconductor light source runs continuously, or may operate in a pulsed mode. When operating in a pulsed mode, the solid state laser may be gain-switched.

In FIG. 4 is illustrated an alternative version of the first embodiment 200', in which the solid state laser is fabricated between the substrate 202 and the LED 226. An advantage of this version is that it is advantageous to the growth procedure of different layers. The placement of the mirrors 240 and 242 shown in FIG. 4 results in the output of the solid state laser 238 being directed through the substrate 222. However, it is understood that the solid state laser 238 may alternatively be provided with a lower high reflector, and an upper output coupler, in which case the upper output coupler is transparent to the pump light and the output from the solid state laser is directed in an upwards direction through the LED structure 226.

Example 2. Indium Gallium Nitride Vertical Cavity Surface Emitting Laser-Pumped Vertical Cavity Erbium Solid State Laser.

Figure 5:
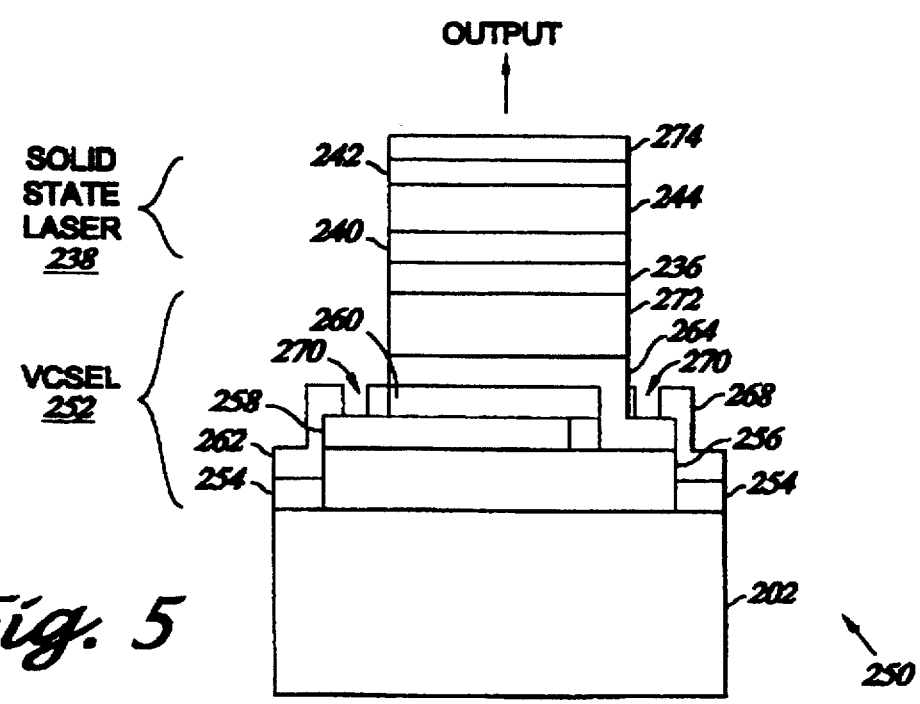
FIG. 5 illustrates a monolithically integrated, self-pumped solid state laser according to a second embodiment of the present invention.

FIG. 5 illustrates a second embodiment of the present invention 250, in which the light source used to pump the solid state laser is a vertical cavity, surface emitting semiconductor laser (VCSEL). Elements of this embodiment which are similar to those described above for the first embodiment have been given the same numbers and will not be described in detail here.

The second embodiment 250 includes a substrate 252, preferably of $Al_2O_3$ although other materials such as silicon carbide or magnesium aluminate spinel may be used.

The VCSEL illustrated in FIG. 5 is the second embodiment of the VCSEL described in related patent applications patent No. 4,873,696, entitled Vertical Cavity Lasers, filed by L. A. Coldren et al. This related patent application also describes the method of growing such a VCSEL.

The second embodiment of the present invention 250 employs a substrate 202 on which has been grown a lower VCSEL mirror 256, which is a quarter wave stack, preferably of alternating gallium nitride and aluminum nitride layers. On the outer perimeter of the lower VCSEL mirror 256 is found a first inhibitor layer 254, which is employed to inhibit horizontal growth of the lower mirror 256 as it is being grown.

On top of the lower mirror 256 is grown a lower contact layer 258. Above the lower contact layer 258 is grown the active layer 260, preferably formed from indium gallium nitride. Above the active layer 260 is the upper contact layer 264. Each of the lower and upper contact layers 258 and 264 have respective third and second inhibitor layers 262 and 268, in which are formed gaps 270 in which electrical contacts can be formed so that electrical current may be passed between the lower contact layer 258 and the upper contact layer 264. A VCSEL of this design operates under a principle where electrons passing into the active region 260 from either of the contact layers 258 and 264 avalanches and produces photons whose energy is that of the band gap of the active region 260. Above the upper contact layer 264 is grown a VCSEL upper mirror 272. Like the lower mirror 256, the upper mirror 272 is a quarter wave stack, preferably formed from alternating layers of gallium nitride and aluminum nitride. The reflectivity of the lower mirror 256 is preferably close to 100%, in order to prevent laser light from being lost into the substrate 202. The upper mirror 272 preferably has a reflectivity ranging from 90% to 95%.

Above the upper mirror 272 is grown a buffer layer 236 upon which the solid state laser 238 is fabricated. Like the previous embodiment, the solid state laser includes a pump mirror 240 and an output mirror 242, between which is situated the metal ion doped semiconductor active layer 244. The solid state laser 238 has a vertical cavity configuration, which is parallel to the cavity configuration of the VCSEL 252.

A pump light reflector layer 274 may be deposited above the solid state laser 238. The pump light reflector layer 274 is a quarter wave stack of alternating layers, preferably of gallium nitride and aluminum gallium nitride. The pump light reflector layer 274 reflects pump light emitted by the VCSEL 252 which is not absorbed by the solid state laser 238 by its first pass through the active medium 244, and would otherwise be lost. The pump light reflector layer 274 should transmit the laser light at wavelength $\lambda_s$ which is emitted by the solid state laser 238.

It is understood that other configurations of VCSEL 252 may also be employed to pump the solid state laser 238, including the configurations discussed in related patent applications Ser. Nos. 08/707,800, pending and 08/758,241, pending.

Figure 6:
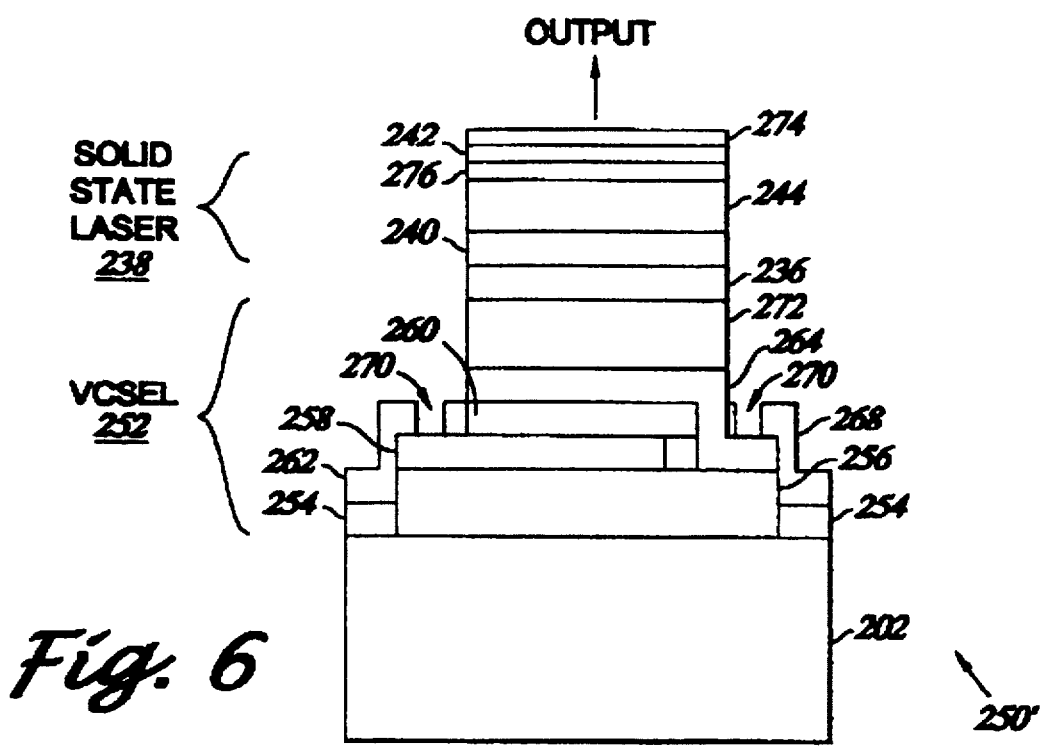
FIG. 6 illustrates an alternative version of the second embodiment of the present invention.

Example 3. Indium Gallium Nitride Vertical Cavity Surface Emitting Laser-Pumped, Q-Switched, Vertical Cavity Erbium Solid State Laser It is known that multiple quantum well (MQW) semiconductor structures can be engineered to demonstrate optical absorption at a selected wavelength and for saturation of the absorption effect to occur over a selected range of incident optical intensities. Thus a MQW may be used to Q-switch the solid state laser 238. MQW structures may be grown as part of the same planar technology fabrication process as the self-pumped monolithically integrated solid state laser, so as to be included as part of the cavity of the solid state laser 238. FIG. 6 illustrates a variation of the second embodiment 250' in which a MQW layer 276 is included in the cavity of the solid state laser 238 between the output mirror 242 and the active medium 244. It is understood that the MQW layer 276 is designed to absorb at the wavelength of the solid state laser 238 and to saturate at a selected saturation intensity according to the operating characteristics of the solid state laser. For the Er active medium in this example, the MQW layer 276 is preferably formed from alternating layers of aluminium nitride and gallium nitride. The MQW layer 276 may also be positioned between the active medium 244 and the pump mirror 240. The use of the MQW layer 276 as a Q-switch advantageously produces short pulses from the solid state laser 238.

Figure 7:
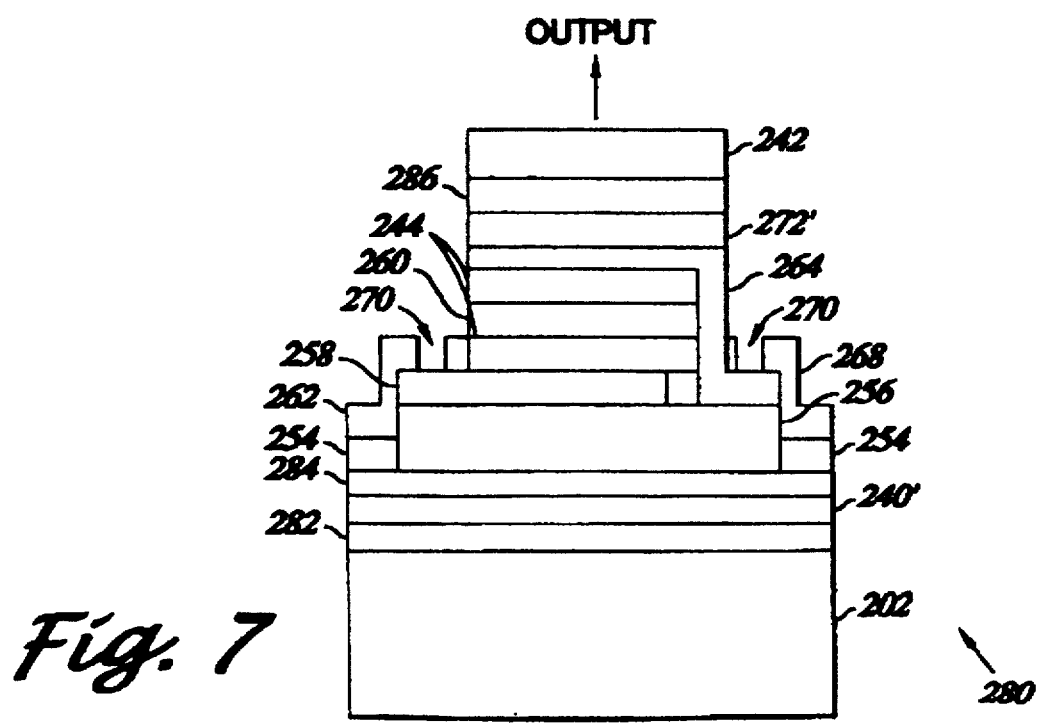
FIG. 7 illustrates a monolithically integrated, self-pumped solid state laser according to a third embodiment of the present invention.

Example 4. Indium Gallium Nitride Vertical Cavity Surface Emitting Laser-Pumped, Nested Vertical Cavity Erbium Solid State Laser FIG. 7 illustrates a third embodiment 280 of the present invention, in which a VCSEL 252 pumps an Er solid state laser. The elements of this embodiment are similar to those described in relation to FIG. 5, except that the solid state laser cavity is nested within the semiconductor laser cavity. An advantage of this embodiment is enhanced excitation or pumping of the metal ions may occur.

The third embodiment 280 includes a substrate 202, on top of which is grown a first buffer layer 282 to provide a relatively defect-free surface and lattice matching to a subsequently grown layer. Once the buffer layer is grown, the lower mirror 240' of the solid state laser, which is preferably a high reflector, may have a reflectivity at the solid state laser wavelength ranging from 10% to 100%. In this embodiment the pump beam is not transmitted directly through the lower mirror 240'.

Above the solid state laser lower mirror 240 is a second buffer layer, to provide lattice matching between the solid state laser lower mirror and the VCSEL lower mirror 256.

The solid state laser active medium 244 includes two layers which sandwich the semiconductor active layer 260. Typically, the active medium 244 is composed of Indium Gallium Nitride) doped with Er to a concentration ranging from $10^{12}$ to $10^{22}$ atoms per cc. Above the active medium 244 is the upper contact layer 264 and the upper VCSEL mirror 272'. Note that in this embodiment the solid state laser active medium 244 is within the VCSEL cavity, and so the metal ions in the active medium 244 are pumped with intracavity pump light. Thus the upper VCSEL mirror 272' may be provided as a high reflector at the VCSEL wavelength, $\lambda_s$.

A third buffer layer 286 is provided above the VCSEL upper mirror 272' so as to provide for lattice matching between the VCSEL upper mirror 272' and the solid sate laser output coupler 242.

Figure 8:
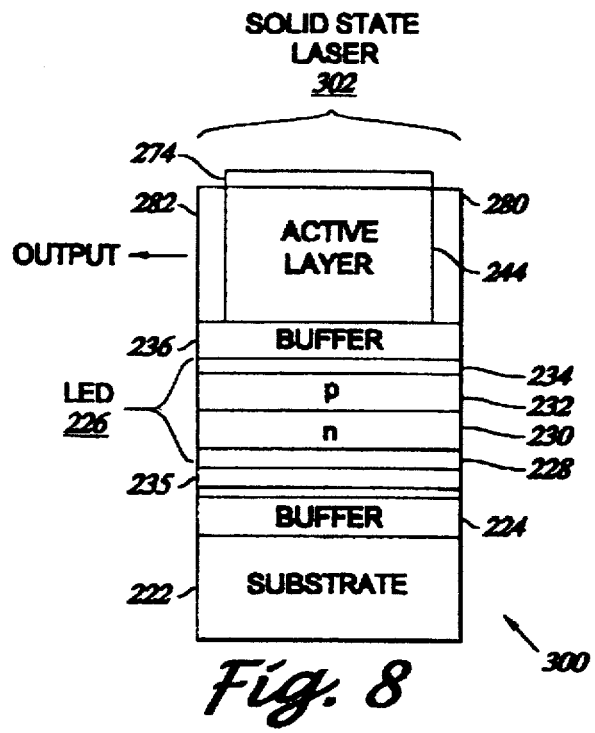
FIG. 8 illustrates a monolithically integrated, self-pumped solid state laser according to a fourth embodiment of the present invention.

Example 5. Indium Gallium Nitride LED-Pumped Horizontal Cavity Erbium Solid State Laser FIG. 8 shows the invention according to a fourth embodiment, in which the self-pumped monolithically integrated solid state laser 300 is pumped using a LED 302, but where the axis of the solid state laser 304 lies horizontally, in a direction perpendicular to the pump light entering the active medium from the LED 302. An advantage of this embodiment is that the threshold population inversion density of the solid state laser may be reduced relative to the oscillation threshold of the solid state lasers of the first two embodiments, because the horizontal solid state laser may be fabricated with a longer gain path length than the vertical cavity solid state laser.

The self-pumped, monolithically integrated, horizontal cavity solid state laser 300 is fabricated using steps similar to those employed in fabricating the embodiment 220 of FIG. 2, except that the active layer 244 is deposited on the buffer layer 236 with no intervening mirror structure separating the active layer 244 and the buffer layer 236. A pump light reflection layer 274 is preferably deposited on top of the active layer 244 in order to promote enhanced absorption of the pump light entering the horizontal cavity sold state laser 304. After deposition of the active layer 244, the edges of the active layer 244 are etched, in order to produce good quality surfaces by conventional methods of surface preparation. After etching, dielectric mirrors 280 and 282 are deposited on the edges of the active medium 244. The dielectric mirrors 280 and 282 are typically deposited using conventional coating techniques, such as e-beam evaporation or sputtering. The first dielectric mirror 280 is preferably a high reflector at the wavelength of the solid state laser. The second dielectric mirror 282 is preferably an output coupler, having a reflectivity chosen according to standard laser engineering principles and depending on such design parameters as laser gain and wavelength. The horizontal cavity solid state laser emits a laser output in the direction as indicated in FIG. 8 by the arrow. Typically, the mirrors 280 and 282 are formed using alternating layers of gold or silver. The mirrors 280 and 282 may extend down the sides of the structure 300, below the active layer 274, without impairing the operation of the structure 300.

It is understood that a horizontal solid state laser is not restricted to being used in conjunction with an LED 302 pumping source, but may also be used with other semiconductor pump light sources, including a VCSEL and an edge emitting semiconductor laser.

Figure 9:
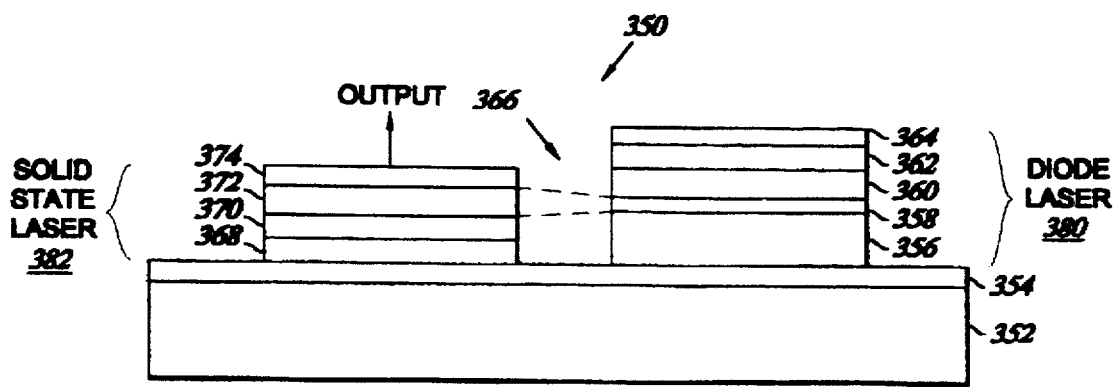
FIG. 9 illustrates a monolithically integrated, self-pumped solid state laser according to a fifth embodiment of the present invention.

Example 6. Indium Gallium Nitride Edge Emitting Semiconductor Diode Laser-Pumped, Vertical Cavity Erbium Solid State Laser In FIG. 9 is illustrated a fifth embodiment of the invention in which an edge emitting semiconductor diode laser 380 is fabricated on a substrate 352 adjacent a solid state laser 382. The diode laser 380 emits an output laser transmission 366 which pumps the solid state laser 382.

An epitaxially grown layer 354 of aluminum nitride is grown on top of the substrate 352. Substrate 352 is preferably made from saphire but may be made from other suitable materials. The epitaxially layer 356 is typically designed so as to lattice match with the subsequently grown n-InGaN layer 356. On top of the n-InGaN layer 356 is grown a quantum well InGaN active layer 358. The composition of material in the active layer 358 is typically indium gallium nitride. In addition, the active layer may include more than one quantum well layer for the generation of diode laser light.

On top of the active layer 358 is grown a p-InGaN layer, above which is grown a p+ InGaN layer, which acts as an electrode. A metal contact 364 is deposited on top of the p+ layer 362, and is typically formed from a mixture of chromium and gold, although other suitable metals or metal alloys may also be used as electrical contacts. Adjacent the diode laser 380 is grown a solid state laser 382. The solid state laser 382 is grown on a buffer layer 368 which provides lattice matching between the subsequent layer and the epitaxially grown layer 354. The buffer layer 368 is typically made from aluminum nitride.

The lower mirror of the solid state laser 372 is typically a high reflector at the solid state laser wavelength, and is fabricated from multiple layer quarter wave stack of alternating layers of gallium nitride and aluminum nitride. Note that in this embodiment, unlike other embodiments of the present invention, the solid state laser higher reflector does not have to be transparent to pump laser light. Above the lower mirror 370 is grown the active layer 372, typically a layer of indium gallium nitride which is doped with erbium ions. The erbium ions are doped to a concentration ranging from $10^{19}$ to $10^{20}$ atoms per cc and the thickness of the active layer 372 typically ranges from 1–2 µm. Above the active layer 372 is deposited the solid state laser output coupler 374, which is also formed from a multiple layer stack of aluminum nitride and gallium nitride. The reflectivity of the output coupler 374 is selected in accordance with standard laser design principles of laser gain. The output from the solid state laser is directed upwards, away from the substrate 352, as shown by the arrow in FIG. 9.

The monolithic integrated, self-pumped solid state laser shown in FIG. 9 is fabricated using selective area growth techniques. Typically, the area where the solid state laser 382 is to be grown is covered by a barrier layer (not shown) and the structure of the diode laser 380 grown. Note that the diode laser 380 may be formed from known semiconductor diode laser structures, including indium, gallium, aluminum phosphide structures, single or multiple quantum well structures, and may also include lateral current and light confinement. After fabrication of the diode laser 380, the barrier layer is removed and a second barrier layer placed on top of the diode laser 380. The solid state laser and 382 is then grown according to standard techniques. After completion of the solid state laser 382 the second barrier layer is removed, thus allowing light from the diode laser 380 to couple into the active layer 372.

It is understood that the substrate 352 used for the structure 350 may also serve as an electrode for the diode laser 380, as is known for semiconductor diode lasers.

If the diode laser 380 is a one dimensional array of active stripes, each radiating output light in parallel, then the solid state laser 382 may also be formed as a one dimensional array, having pumped regions which correspond to each individual emitting stripe of the diode laser 380.

This concludes the description of the preferred embodiments of the invention. The following paragraphs describe some alternative methods of accomplishing the same objects.

The choice of metal ion for the solid state laser, and therefore the emission wavelength of the solid state laser, sets the material parameters for all other components of the monolithic integrated self-pumped solid state laser. Erbium has been employed in the examples illustrated above, which determined the thickness and the material for the layers in the solid state laser mirrors. The choice of Er also determines the semiconductor material used in the semiconductor pump source, in that the semiconductor pump source generates light in the absorption band of the metal ion. The choice of metal ion also determines the materials used for the mirrors, if any, on the semiconductor pump source and also the substrate on which the whole structure is fabricated. The choice of a metal ion different from Er results in the use of different materials and layer thicknesses from those given in the examples. However, it is understood that the use of different materials and layer thicknesses are design issues to be decided upon according to standard engineering principles, and that the invention disclosed herein is not dependent on the use of the particular materials used in the examples. In addition, a solid state active layer may include an intermediary between the pump light and the metal ion of the solid state laser, for example a second metal ion species. A laser may incorporate such a second metal ion species in order to channel optical energy from the pump light to the laser metal ion.

Furthermore, it is understood that the embodiments illustrated here do not show all the possible configurations for a monolithically integrated, self-pumped solid state laser. For instance, a VCSEL or an edge emitting semiconductor laser may be used to pump a monolithically grown horizontal cavity solid state laser, rather than pump a vertical cavity laser. Where an edge emitting laser is employed to pump a horizontal cavity solid state laser, it is understood that the pump light may enter the solid state laser cavity through a pump mirror, or may enter through the side of the solid state laser cavity.

The foregoing description of the preferred embodiment of the invention has been presented for the purposes of illustration and description. It is not intended to be exhaustive or to limit the invention to the precise form disclosed. Many modifications and variations are possible in light of the above teaching. Although the description has mainly be directed to semi-conductor layers, the inventor has equal applicability to dielectric or polymer layers. It is intended that the scope of the invention be limited not by this detailed description, but rather by the claims appended hereto.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An integrated solid state laser device comprising:
    a substrate;
    a semiconductor light source to provide pump light; and
    a solid state laser positioned between the substrate and the semiconductor light source and including a layer doped with metal ions, and wherein the metal ions are pumped by pump light emitted by the semiconductor light source.

2. The laser device of claim 1, wherein the solid state laser comprises:
    a pump mirror transparent to the pump light,
    an output mirror, and
    a semiconductor layer deposited between the pump and output mirrors, the semiconductor layer being doped with active metal ions; wherein the pump light enters the solid state laser through the pump mirror.

3. The laser device of claim 1, wherein the semiconductor light source is a light emitting diode.

4. The laser device of claim 1, wherein the semiconductor light source is a semiconductor laser.

5. The laser device of claim 4, wherein the semiconductor light source is a vertical cavity laser comprising:
    a high reflector mirror;
    an output coupler; and
    an active semiconductor layer between the high reflector mirror and the output coupler.

6. The laser device of claim 1, wherein the active metal ions are selected from one of the group consisting of lanthanide rare earth elements or the transition metals, erbium, neodymium, praseodymium, europium, thulium, ytterbium, cerium, titanium and chromium.

7. The laser device of claim 5, wherein the active semiconductor layer is selected from the group consisting of aluminum nitride, gallium nitride, indium nitride, aluminum gallium nitride, aluminum gallium indium nitride, gallium arsenide, aluminum gallium arsenide, aluminum gallium indium arsenide, indium arsenide, indium arsenide nitride and indium gallium arsenide nitride.

8. The laser device of claim 1, wherein the solid state laser further comprises a semiconductor Q-switch layer so as to produce Q-switched pulses from the solid state laser.

9. The laser structure of claim 1, further comprising a power supply for supplying power to the semiconductor light source.

10. The laser structure of claim 1 further comprising a pump light reflector layer to reflect pump light into the solid state laser.

11. The laser structure of claim 1, wherein the semiconductor light source comprises a first axis parallel to a primary direction of pump light emission and the solid state laser has a second axis essentially parallel to the first axis.

12. The laser structure of claim 1, wherein the semiconductor light source comprises a first axis parallel to a primary direction of pump light emission and the solid state laser has a second axis essentially perpendicular to the first axis.

13. An integrated, self-pumped laser device, comprising:
    a substrate;
    a vertical cavity laser on the substrate, comprising
    a first mirror,
    a second mirror, and
    a semiconductor gain layer between the first and second mirrors, the vertical cavity laser having a first laser axis essentially perpendicular to said substrate and emitting pump light along said first laser axis; and
    a solid state laser over the vertical cavity laser, comprising:
    a pump mirror,
    an output mirror, and
    an active semiconductor layer doped with metal ions pumped by the pump light, the solid state laser having a second laser axis essentially parallel to the first laser axis.

14. The laser device of claim 13, wherein the metal ions are selected from one of the group consisting of lanthanide rare earth elements or the transition metals, erbium, neodymium, praseodymium, europium, thulium, ytterbium, cerium, titanium and chromium.

15. The laser device of claim 13, wherein the active semiconductor layer is selected from the group consisting of aluminum nitride, gallium nitride, indium nitride, aluminum gallium nitride, aluminum gallium indium nitride, gallium arsenide, aluminum gallium arsenide, aluminum gallium indium arsenide, indium arsenide, indium arsenide nitride and indium gallium arsenide nitride.

16. The laser device of claim 13, wherein the solid state laser structure further comprises a Q-switch layer so as to produce Q-switched pulses from the solid state laser structure.

17. The laser device of claim 13, wherein the solid state laser lies entirely outside the vertical cavity laser.

18. The laser device of claim 13, wherein the entire solid state laser lies between the first and second mirrors of the vertical cavity laser.

19. The laser device of claim 13, wherein at least a part of the solid state laser lies between the first and second mirrors of the vertical cavity laser.

20. The laser device of claim 13, further comprising a power supply for supplying power to the semiconductor light source.

21. The laser device of claim 13, further comprising a pump light reflector layer to reflect pump light into the solid state laser.

22. An integrated, self-pumped laser device, comprising:
    a substrate;
    a vertical cavity laser on the substrate, comprising
    a first mirror,
    a second mirror, and
    a semiconductor gain layer between the first and second mirrors, the vertical cavity laser having a first laser axis essentially perpendicular to said substrate and emitting pump light along said first laser axis; and
    a solid state laser over the vertical cavity laser, comprising:
    a pump mirror,
    an output mirror, and
    an active semiconductor layer doped with metal ions pumped by the pump light, the solid state laser having a second laser axis essentially perpendicular to the first laser axis.

23. The laser device of claim 22, wherein the metal ions are selected from one of the group consisting of lanthanide rare earth elements or the transition metals, erbium, neodymium, praseodymium, europium, thulium, ytterbium, cerium, titanium and chromium.

24. The laser device of claim 22, wherein the active semiconductor layer is selected from the group consisting of aluminum nitride, gallium nitride, indium nitride, aluminum gallium nitride, aluminum gallium indium nitride, gallium arsenide, aluminum gallium arsenide, aluminum gallium indium arsenide, indium arsenide, indium arsenide nitride and indium gallium arsenide nitride.

25. The laser structure of claim 22, further comprising a power supply for supplying power to the semiconductor light source.

26. The laser structure of claim 22, further comprising a pump light reflector layer.

27. An integrated, self-pumped laser device, comprising:
a substrate;
an edge emitting semiconductor laser on the substrate, the vertical cavity laser having a first laser axis essentially parallel to said substrate and emitting pump light along the first laser axis; and
a solid state laser on the substrate adjacent the edge emitting semiconductor laser, the solid state laser comprising:
a first mirror,
an output mirror, and
an active semiconductor layer doped with metal ions pumped by the pump light,
the solid state laser having a second laser axis essentially parallel to the first laser axis.

28. The laser device of claim 27, wherein the metal ions are selected from one of the group consisting of lanthanide rare earth elements or the transition metals, erbium, neodymium, praseodymium, europium, thulium, ytterbium, cerium, titanium and chromium.

29. The laser device of claim 27, wherein the active semiconductor layer is selected from the group consisting of aluminum nitride, gallium nitride, indium nitride, aluminum gallium nitride, aluminum gallium indium nitride, gallium arsenide, aluminum gallium arsenide, aluminum gallium indium arsenide, indium arsenide, indium arsenide nitride and indium gallium arsenide nitride.

30. The laser structure of claim 27, further comprising a power supply for supplying power to the semiconductor light source.

31. The laser structure of claim 27, further comprising a pump light reflector layer to reflect pump light into the solid state laser.

32. An integrated, self-pumped laser device, comprising:
a substrate;
an edge emitting semiconductor laser on the substrate, the vertical cavity laser having a first laser axis essentially parallel to said substrate and emitting pump light along the first laser axis; and
a solid state laser on the substrate adjacent the edge emitting semiconductor laser, the solid state laser comprising:
a first mirror,
an output mirror, and
an active semiconductor layer doped with metal ions pumped by the pump light,
the solid state laser having a second laser axis essentially perpendicular to the first laser axis.

33. The laser device of claim 32, wherein the metal ions are selected from one of the group consisting of lanthanide rare earth elements or the transition metals, erbium, neodymium, praseodymium, europium, thulium, ytterbium, cerium, titanium and chromium.

34. The laser device of claim 32, wherein the active semiconductor layer is selected from the group consisting of aluminum nitride, gallium nitride, indium nitride, aluminum gallium nitride, aluminum gallium indium nitride, gallium arsenide, aluminum gallium arsenide, aluminum gallium indium arsenide, indium arsenide, indium arsenide nitride and indium gallium arsenide nitride.

35. The laser device of claim 32, wherein the solid state laser structure further comprises a Q-switch layer so as to produce Q-switched pulses from the solid state laser structure.

36. The laser structure of claim 32, further comprising a power supply for supplying power to the semiconductor light source.

37. The laser structure of claim 32, further comprising a pump light reflector layer to reflect pump light into the solid state laser.

38. An integrated solid state laser device comprising:
a substrate;
a semiconductor light source to provide pump light; and
a solid state laser coupled to the semiconductor light source, wherein the semiconductor light source is positioned between the solid state laser and the substrate, the solid state laser including a layer doped with metal ions, and wherein the metal ions are pumped by pump light emitted by the semiconductor light source.

39. The laser device of claim 38, wherein the solid state laser comprises:
a pump mirror transparent to the pump light,
an output mirror, and
a semiconductor layer deposited between the pump and output mirrors, the semiconductor layer being doped with active metal ions; wherein the pump light enters the solid state laser through the pump mirror.

40. The laser device of claim 38, wherein the semiconductor light source is a light emitting diode.

41. The laser device of claim 38, wherein the semiconductor light source is a semiconductor laser.

42. The laser device of claim 41, wherein the semiconductor light source is a vertical cavity laser comprising:
a high reflector mirror;
an output coupler; and
an active semiconductor layer between the high reflector mirror and the output coupler.

43. The laser device of claim 38, wherein the active metal ions are selected from one of the group consisting of lanthanide rare earth elements or the transition metals, erbium, neodymium, praseodymium, europium, thulium, ytterbium, cerium, titanium and chromium.

44. The laser device of claim 42, wherein the active semiconductor layer is selected from the group consisting of aluminum nitride, gallium nitride, indium nitride, aluminum gallium nitride, aluminum gallium indium nitride, gallium arsenide, aluminum gallium arsenide, aluminum gallium indium arsenide, indium arsenide, indium arsenide nitride and indium gallium arsenide nitride.

45. The laser device of claim 38, wherein the solid state laser further comprises a semiconductor Q-switch layer so as to produce Q-switched pulses from the solid state laser.

46. The laser structure of claim 38, further comprising a power supply for supplying power to the semiconductor light source.

47. The laser structure of claim 38, further comprising a pump light reflector layer to reflect pump light into the solid state laser.

48. The laser structure of claim 38, wherein the semiconductor light source comprises a first axis parallel to a primary direction of pump light emission and the solid state laser has a second axis essentially parallel to the first axis.

49. The laser structure of claim 38, wherein the semiconductor light source comprises a first axis parallel to a primary direction of pump light emission and the solid state laser has a second axis essentially perpendicular to the first axis.

* * * * *